United States Patent
Roohparvar

(10) Patent No.: US 6,452,836 B1
(45) Date of Patent: Sep. 17, 2002

(54) NON-VOLATILE MEMORY DEVICE WITH ERASE CYCLE REGISTER

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/803,623

(22) Filed: Mar. 9, 2001

(51) Int. Cl.[7] ............................................... G11C 16/06
(52) U.S. Cl. ............................ 365/185.22; 365/185.29; 365/185.33
(58) Field of Search ....................... 365/185.22, 185.29, 365/185.33

(56) References Cited

U.S. PATENT DOCUMENTS

| | | |
|---|---|---|
| 5,568,426 A | 10/1996 | Roohparvar et al. |
| 5,579,262 A | 11/1996 | Song |
| 5,581,503 A | 12/1996 | Matsubara et al. |
| 5,583,809 A | 12/1996 | Noguchi et al. |
| 5,600,595 A * | 2/1997 | Ogura .................... 365/185.33 |
| 5,615,159 A | 3/1997 | Roohparvar |
| 5,621,687 A * | 4/1997 | Doller .................... 365/185.22 |
| 5,627,784 A | 5/1997 | Roohparvar |
| 5,677,879 A | 10/1997 | Roohparvar et al. |
| 5,677,885 A | 10/1997 | Roohparvar |
| 5,801,985 A | 9/1998 | Roohparvar et al. |
| 5,847,996 A | 12/1998 | Guterman et al. |
| 5,880,996 A | 3/1999 | Roohparvar |
| 5,907,700 A | 5/1999 | Talreja et al. |
| 5,944,837 A | 8/1999 | Talreja et al. |
| 6,026,465 A | 2/2000 | Mills et al. |
| 6,104,667 A | 8/2000 | Akaogi |
| 6,222,772 B1 | 4/2001 | Choi et al. |
| 6,266,282 B1 | 7/2001 | Hwang et al. |

FOREIGN PATENT DOCUMENTS

JP    0148877    6/1991

OTHER PUBLICATIONS

Prince "Semiconductor Memories," *Electrically Erasable PROM Technology and Architecture* 1983, Wiley 2d ed, pp 185–186.

* cited by examiner

Primary Examiner—Huan Hoang
(74) Attorney, Agent, or Firm—Fogg Slifer Polglaze Leffert & Jay P.A.

(57) ABSTRACT

A non-volatile memory device includes an array of non-volatile memory cells. The memory has control circuitry to apply erase voltage pulses to the non-volatile memory cells and perform erase verification operations. A pulse counter is coupled to count the erase pulses applied to the non-volatile memory cells. A programmable erase pulse register has been described that indicate a number of initial erase pulses that can be applied to the non-volatile memory cells during an initial verification operation prior to performing a scan operation of the memory block. The control circuitry can also apply additional erase pulses following subsequent erase verification operations. A second programmable erase pulse register is provided to indicate a number of subsequent erase pulses that can be applied to the non-volatile memory cells before performing additional scan operations.

24 Claims, 5 Drawing Sheets

NON-VOLATILE MEMORY DEVICE WITH ERASE CYCLE REGISTER

TECHNICAL FIELD OF THE INVENTION

The present invention relates generally to non-volatile memories and in particular the present invention relates to erase operations in a non-volatile memory device.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents. Computers often contain a small amount of read-only memory (ROM) that holds instructions for starting up the computer. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time.

A typical Flash memory comprises a memory array that includes a large number of memory cells arranged in a row and column fashion. Each memory cell includes a floating gate field-effect transistor capable of holding a charge. The cells are usually grouped into erasable blocks. Each of the memory cells can be electrically programmed on a random basis by charging the floating gate. The charge can be removed from the floating gate by an erase operation. Thus, the data in a cell is determined by the presence or absence of the charge in the floating gate.

To program a memory cell, a high positive voltage Vg is applied to the control gate of the cell. In addition, a moderate positive voltage is applied to the drain (Vd) and the source voltage (Vs) and the substrate voltage (Vsub) are at ground level. These conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to reduce the effective threshold voltage of the cell as compared to a cell that has not been programmed.

In flash memories, blocks of memory cells are erased as in groups. This is achieved by putting a negative voltage on the wordlines of an entire block and coupling the source connection of the entire block to Vcc (power supply), or higher. This creates a field that removes electrons from the floating gates of the memory elements. In an erased state, the memory cells can be activated using a lower control gate voltage.

A common problem with flash memory cells is over-erasure. A cell that is erased past a certain point becomes depleted and cannot be fully turned off. That is, too many electrons are removed from the floating gate, and the memory cell floating gate voltage becomes more positive than the threshold of the cell. The cell, therefore, cannot be turned off even if the control gate is at a ground potential. An over-erased memory cell can cause all memory cells coupled to the same column to be read as erased cells, even though they may be programmed.

In current flash memory cells, a pre-program cycle is performed on the block of memory cells prior to performing an erase cycle. As such, all the cells in a block are first programmed. The cells are then erased until all the cells are completely erased. A threshold voltage (Vt) distribution tightening operation is performed following the erase operation to recover memory cells that are over erased. As flash memory devices increase in memory cell density, the time needed to perform a complete erase operation also increases. In flash memories, a substantial part of the erase cycle time is spent on the erase cycle. Out of a typical 1-second erase operation about one-half of the time is spent on pre-programming the memory cells, and the other half is used on the erase cycle. An erase pulse requires about 10ms, while an erase verification operation requires less than 1 $\mu$s. With the density of flash memories increasing, the total time to verify all the locations is becoming a substantial part of the cycle. For instance, in a 64 Megabit flash device organized in 16 erasable blocks, there are four million locations that need to be verified during an erase operation. A typical 1 $\mu$s time for each verify cycle results in a verify time of 4 seconds. Further, memory cells are being verified for levels that are much tighter than their regular read levels. Thus, they need to be sensed much slower. For instance, a normal read is verifying that an erased cell has a threshold level (Vt) that is less than 4.5V. During erase verification, the memory verifies that the cell has a Vt that is less than 3V. This margin is smaller than prior memories and is more susceptible to noise.

For the reasons stated above, and for other reasons stated below which will become apparent to those skilled in the art upon reading and understanding the present specification, there is a need in the art for a flash memory with an improved process for erasing and verifying memory cells.

SUMMARY OF THE INVENTION

The above-mentioned problems with non-volatile memory devices and other problems are addressed by the present invention and will be understood by reading and studying the following specification.

In one embodiment, a non-volatile memory device comprises an array of non-volatile memory cells, a programmable erase pulse register to store X data, and control circuitry to perform erase operations on the array of non-volatile memory cells. The erase operations comprise applying an erase voltage pulse to the non-volatile memory cells and performing an erase verification. The control circuitry terminates the erase verification when X erase pulses are applied to the array.

In another embodiment, a flash memory comprises an array of non-volatile memory cells arranged in erasable blocks, a first programmable erase pulse register to store first data, a second programmable erase pulse register to store second data, and control circuitry to perform first and second erase verification operations on the non-volatile memory cells. The control circuitry terminates the first erase verification when X erase pulses are applied to the array in response to the first data, and the control circuitry terminates the second erase verification when Y erase pulses are applied to the array in response to the second data.

A method of erasing a non-volatile memory device comprises performing a memory erase verification operation, reading a non-volatile register, and terminating the memory erase verification operation, in response to the non-volatile register, after applying X erase pulses to memory cells.

In yet another embodiment, a method of erasing a flash memory device comprises reading a first non-volatile register, applying X erase pulses to memory cells during a first erase verification operation, terminating the first erase verify operation in response to the first non-volatile register, reading a second non-volatile register, applying Y erase pulses to memory cells during a second erase verification operation, and terminating the second erase verify operation in response to the first non-volatile register.

A non-volatile memory device is provided that comprises an array of nonvolatile memory cells, control circuitry to apply erase voltage pulses to the non-volatile memory cells and perform erase verification and memory scan operations, and a pulse counter coupled to count the erase pulses applied to the non-volatile memory cells. A programmable erase pulse register is coupled to the control circuitry to indicate a plurality of erase pulses to be applied to the non-volatile memory cells during the erase verification operation prior to performing the memory scan operation.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
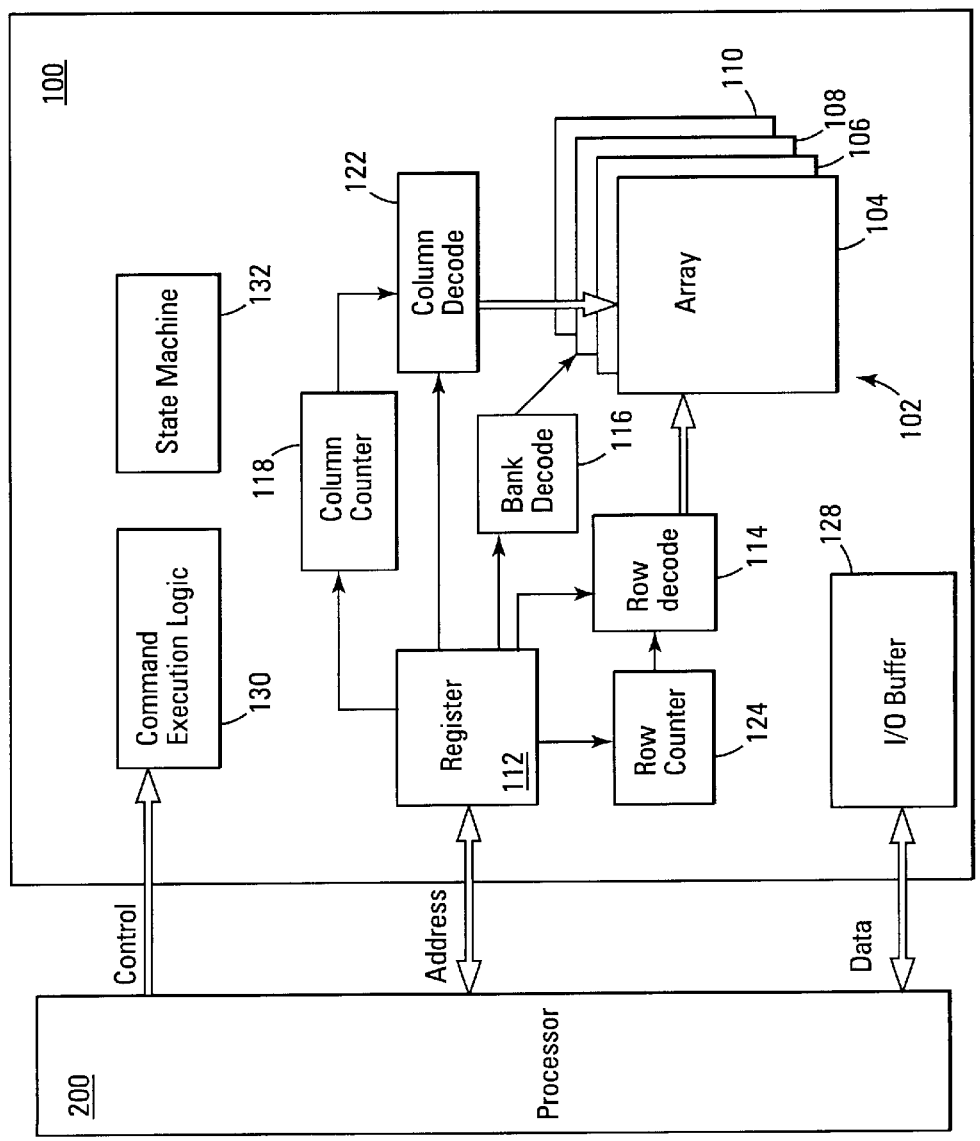
FIG. 1 is a block diagram of a memory device of an embodiment of the present invention.

Referring to FIG. 1, a block diagram of one embodiment of a synchronous flash memory of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable blocks of memory cells. The data stored in the memory can be accessed using externally provided location addresses received by address register 112 via address signal connections. The addresses are decoded using row decode circuitry 114. Row address counter 124 is also provided. The addresses are also decoded using bank decode logic 116. To access an appropriate column of the memory, column address counter 118 couples addresses to column decode circuitry 122. Data is input and output through I/O circuit 128 via data connections. I/O circuit 128 includes data output registers, an output driver and an output buffer. Command execution logic 130 is provided to control the basic operations of the memory device. A state machine 132 is also provided to control specific operations performed on the memory array and cells. The command circuit 130 and/or state machine 132 can be generally referred to as control circuitry to control read, write, erase and other memory operations. The data connections are typically used for bi-directional data communication. The memory can be coupled to an external processor 200 for operation or testing.

The memory includes a pulse counter circuit to keep track of voltage pulses applied to the memory cells during erase and programming operations. The pulse counter is typically used to monitor a total number of pulses applied. In an embodiment of the present invention, the pulse counter is used in conjunction with an pulse register to improve erase operation performance, as explained below.

The memory cell array of a flash memory is typically arranged in erasable blocks. In one embodiment of the present invention, the erasable blocks are further arranged in sub-blocks. For example, a 16 Meg memory array can be arranged in four erasable blocks of 4 Meg where each of these blocks contain 16 sub-blocks.

During a typical prior art erase operation, an erase pulse, or series of erase pulses, is coupled to an addressed array block. The memory internal control, or state machine, then steps through each memory cell of the block to determine if data in the cells are erased (logical 1). The control circuitry stops verifying when it reaches a memory cell location that is not erased. The memory then applies another erase pulse to the block and begins another verification operation at the first memory cell location of the block. This process is repeated until all cells in the erasable block are verified as being in an erased state. A problem with this prior art erase/verify operation is that the slowest bit in the block dictates the level of erasure of all the memory cells in the block. Further, repeated erase pulses can over-erase a memory cell by removing too much charge from its floating gate. In an example memory, the fastest memory cell requires 5 erase pulses to fully erase the cell, typical memory cells require 10 pulses to erase, and the slowest memory cell in an erasable block requires 30 pulses to erase. With the prior art erase algorithm, the memory cells that are erased after 5 pulses are subjected to an extra 25 erase pulses that could potentially make them over-erased.

The present invention performs an erase operation on a block of memory cells uses a forward-looking scan algorithm. After applying one or more initial erase pulses to the memory block, the memory begins checking the memory cells in the block to determine if the cells are erased. As explained below, the memory may not begin verification until a predetermined number of erase pulses have been applied to the memory array.

Figure 2:
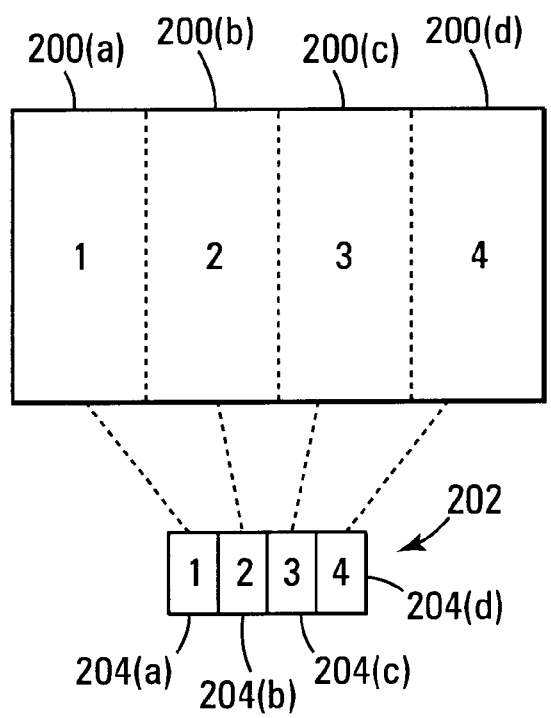
FIG. 2 illustrates sub-blocks of memory cells and corresponding sub-block registers.

Referring to FIG. 2, four sub-blocks 200(a)–(d) of a memory array block are illustrated. A sub-block register 202 is provided in the memory that has bits 202(a)–(d), or storage locations, that correspond to each sub-block. As explained below, the register is used to indicate which sub-blocks are fully erased and which sub-blocks need additional erase operations. The register initially indicates that all of the sub-blocks need to be erased. When all memory cells of a sub-block have been verified to be fully erased, the corresponding register bit is changed to protect the sub-block from further erase pulses. The operation of the register is explained in greater detail below.

Figure 3:
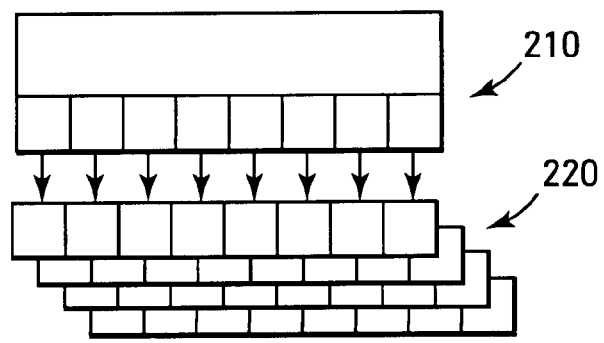
FIG. 3 illustrate an address counter and corresponding address register.

The present invention also contains an address verify register that is used to manage the erase verification operation. Referring to FIG. 3, an address counter 210 is coupled to a sub-block address verify register 220. The sub-block address register can store the contents of the address counter for each sub-block. That is, the sub-block address register is four-deep and each depth corresponds to one of the sub-blocks. In operation, the address verify register is used to store a memory cell address of the first memory cell in a memory sub-block that fails an erase verify test. The sub-blocks are sequentially tested to determine if all memory cells are erased. If a non-erased cell is detected, its address is stored in the sub-block register. This address is used in subsequent verification operations as a start address. As a result, previously verified memory cells are not re-verified.

Figure 4:
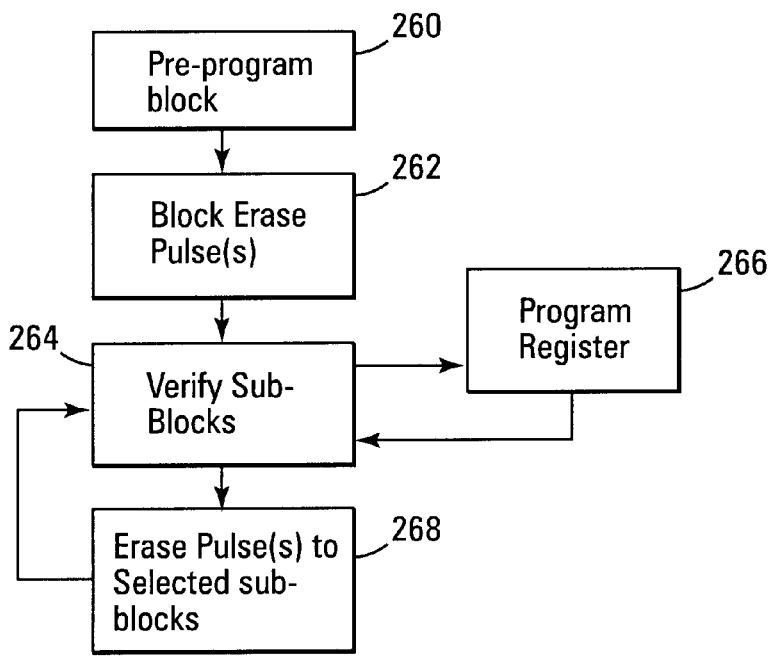
FIG. 4 is a flow chart of an erase operation.

FIG. 4 is a flow chart illustrating a portion of erase and verify operations of an embodiment of the present invention. An erase operation begins by pre-charging all of the memory cells in a block (260). This insures that all memory cells begin the erase operation with substantially the same floating gate charge. The memory bock is then subjected to one or more erase pulses (262). As explained above, the erase pulses are used to remove charge from the memory cell floating gates. Care should be taken to avoid over-erasing a memory cell. That is, too much charge can be removed from the memory cell such that the memory cell conducts current even when its control gate is turned off.

After the initial erase pulses are applied, a verification of each sub-block is performed (264). The verification operation includes reading the memory cells of the sub-block to determine that the cells have been erased. Memory cells are considered erased if they have a floating gate charge (threshold voltage) that is below a predetermined level. When a programmed memory cell is located in a sub-block during the verification operation, the memory programs a register bit corresponding to the sub-block to a first state, such as logic 0 (266). It will be appreciated that the register may be pre-programmed to the first state and a subsequent program operation is not required. After locating a cell that is not erased, the memory jumps to the next sub-block of that erasable block. The memory verifies the next sub-block and if it finds all the cells in that block are erased, the corresponding location of the sub-block register is set to a second state (such as logic 1) indicating that the sub-block does not require any further erase pulses. The memory control then continues to verify all of the sub-blocks of the erasable block.

After all of the sub-blocks in an erase block have been verified, one or more additional erase pulses are applied to the sub-blocks that have a register bit indicating that all of the memory cells have not been erased (268). Additional verify operations are then performed on the sub-blocks that have a register bit programmed to the first state. That is, sub-blocks that do not contain programmed memory cells are not subjected to additional erase pulses. As such, the slowest cell to erase in a block only subjects a small sub-block of memory cells to possible over-erasure. The erase pulses and verification operations are repeated until all of the sub-blocks are fully erased, or a maximum number of erase pulses have been applied.

The threshold voltage (Vt) distribution of the memory cells of the present flash memory, relative to prior flash memory cells, is much tighter. Further, erasing non-volatile memory cells to a very negative threshold level and then bringing the threshold level back to a higher level using recovery methods is not good for memory cell reliability. The present invention provides for a better overall threshold distribution and improves both the reliability and performance of the erase operation. The above described erase/verify operation can reduce the time needed to perform an erase operation by using registers to identify a condition of the sub-blocks. The erase operation can be further improved by tracking a location of the programmed memory cells.

The present invention provides an address pointer for each of the sub-blocks of the memory array. The address pointers are used in conjunction with the memory address counter that is used to step throughout the memory array location. During the verification and scan operations, the memory advances through each memory location and checks for proper erasure. If the memory finds a location that is not erased, it copies the content of the address counter into the address pointer for that sub-block. Since there is at least one location in this sub-block that needs further erase pulses, there is no need to continue verifying or scanning that block. As such, the state machine issues a command to jump to the next sub-block. The memory then jumps to the next sub-block to continue the proper operation.

The contents of the address pointer for the next sub-block are copied to the address counter. The address pointer is initially set to a beginning address of its corresponding sub-block. The sub-block verification or scan continues until all the cells of the block have been checked by the erase verification operation. On subsequent checks of a sub-block, the memory begins at the location of the first programmed memory cell of the previous verification check. That is, the address pointer is copied to the address counter as the start location for each sub-block. When the full sub-block has been erased, the sub-block register can be set, as explained above, to indicate that further erase operations are not required. By re-starting the address location from the last programmed location and jumping to the next sub-block when a programmed cell has been detected within a sub-block, the present invention reduces overhead time.

Figure 5:
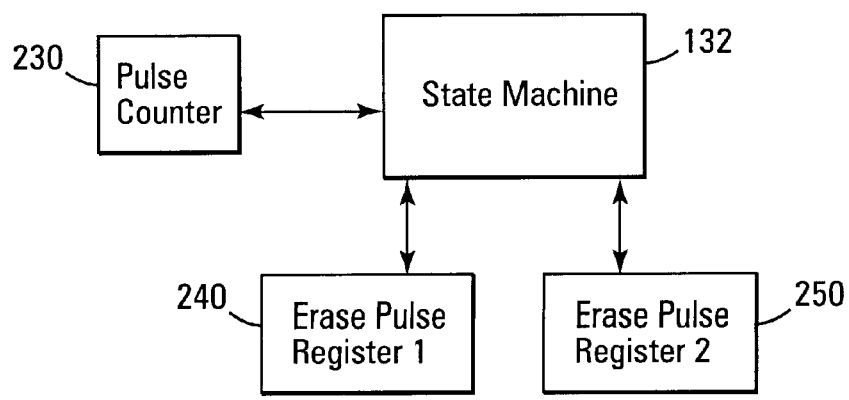
FIG. 5 is a block diagram of a pulse counter and erase register circuitry.

As explained above, the flash memory applies an initial erase pulse to the memory block prior to performing the verification operation. As explained above, during the verification operation additional erase pulses are applied to the memory block. It will be appreciated that a memory cell encountered early in the verification operation could result in numerous erase pulses being applied to the entire block. The present invention reduces the risk that a memory cell subjects the memory block to erases pulses that could result in over-erasure, by using programmable pulse registers. FIG. 5 illustrates state machine 132 coupled to a pulse counter 230. A first pulse register 240 and a second pulse register 250 are coupled to the state machine, and explained below.

The present invention provides non-volatile register 240 that can be programmed to instruct the memory to begin scan operations when a predetermined number of erase pulses have been applied to the memory block. For example, a statistical evaluation may indicate that X-pulses will erase a significant number of the memory cells. When the predetermined number of pulses (X) has been applied to the block during a verification operation, the memory begins the first scan operation. The register can be programmed based upon a statistical analysis of the memory device during fabrication. Likewise, the register can be modified after fabrication if the memory device characteristics change.

A memory device of the present invention can also include a second non-volatile register 250. The second register defines the number of erase pulses that are applied to the memory array sub-blocks that contain non-erased memory cells. As explained above, only sub-blocks that require additional erase pulses are subjected to additional erase pulses during verification operations. The second register is used to initiate subsequent scan operations when conducting the next verification operations of the sub-blocks. The contents of the register can be programmed based upon testing or statistical analysis, as explained above. The contents of the second register are compared to the pulse counter during verification operations. One skilled in the art with the benefit of the present disclosure will appreciate that additional registers, or processing circuitry, can be used to control the number of erase pulses between each verification operation. For example, it may be desired to apply up to X-erase pulses during the second erase verification operation, while less pulses (such as up to X-1) are desired during a third erase verification operation.

Figure 6:
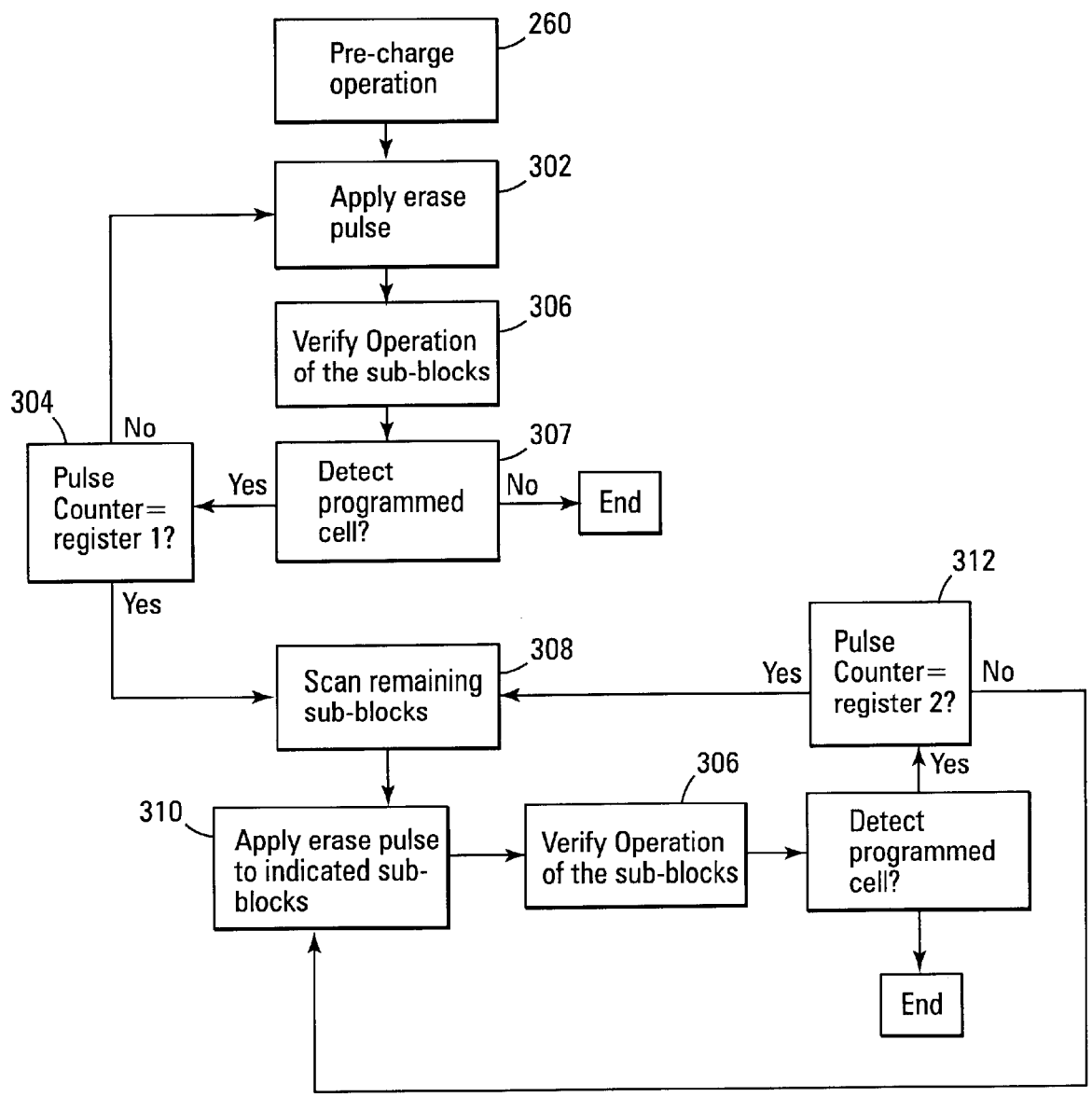
FIG. 6 is a flow chart of a more detailed erase operation of an embodiment of the present invention.
Figure 7:
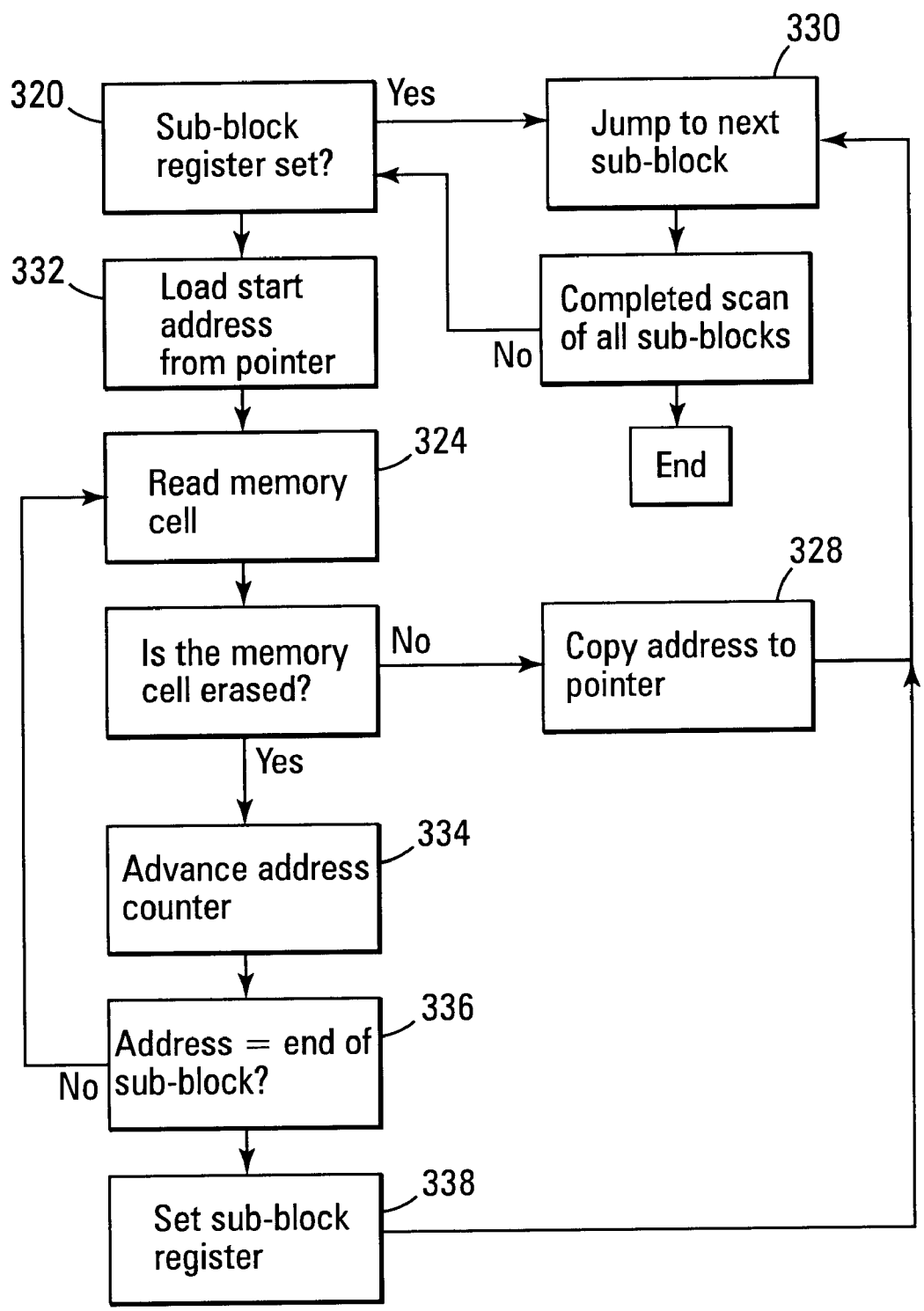
FIG. 7 is a detailed flow chart of a verification operation of an embodiment of the present invention.

Referring to FIG. 6, a flow chart of an erase and verification operation embodiment is described. The erase operation begins with a pre-charge operation (260) to charge all memory cells in a block of the memory array. After the pre-charge operation is complete, an erase pulse is applied to the memory cells in the block (302). A verification operation (306) is then performed on the memory block to determine if the memory cells have been erased. If a programmed memory cell is detected (307), the first pulse register 240 is compared to the pulse counter 230 (304). If the pulse count has not been reached, an additional erase pulse is applied to the block and then the verification operation on the block is resumed by reading each memory cell in each sub-block (306). The scan operation is detailed below with reference to FIG. 7. If the pulse count is reached, the memory then begins a scan operation (308). The scan operation is used to read the memory cells in the sub-blocks to determine if the cells have been erased. If a programmed cell is read during scanning, additional erase pulses are not applied. The memory records the status of the sub-block and moves to the next sub-block to perform the scan. After the scan operation, the memory applies an erase pulse to the block that are contain a programmed cell (310). The memory then performs a verification operation on the sub-blocks that contained a programmed cell. Again, the subsequent verification operations begin at the last known programmed cell address. During the verification operation additional erase pulses may be needed. The erase pulse counter is compared to the second register (312). The scan operation is performed when the pulse threshold is reached. The verification and scan operations continue until the block is fully erased. FIG. 7 illustrates one embodiment of a scan operation 306. During the scan operation of the sub-blocks, the memory determines if the sub-block has its register set to indicate that all cells in the sub-block have been erased (320). If the sub-block is erased, the memory jumps to the next sub-block. If there are sub-blocks remaining to be scanned, the start address for the sub-block is loaded from the address pointer (322). The memory cell at the start address of the sub-block is read (324). If the memory cell is erased, the cell address is incremented (334) with the address counter if the address is not at the end of the block (336) and the next cell is read (324). If a programmed cell is detected, the cell address is copied from the address counter 220 into the verification address pointer for the sub-block (328). The memory then jumps to the next sub-block (330). If the memory reaches the end of the sub-block without detecting any programmed cells, the sub-block register 202 is set (338**) and the next sub-block is scanned. The memory completes the scan operation when all sub-blocks have been scanned. Additional erase pulses may be required for all, or some of the sub-blocks, as described above.

CONCLUSION

A non-volatile memory device has been described that includes an array of non-volatile memory cells. The memory has control circuitry to apply erase voltage pulses to the non-volatile memory cells and perform erase verification operations. A pulse counter is coupled to count the erase pulses applied to the non-volatile memory cells. A programmable erase pulse register has been described that indicate a number of initial erase pulses that can be applied to the non-volatile memory cells during an initial verification operation prior to performing a scan operation of the memory block. The control circuitry can also apply additional erase pulses following subsequent erase verification operations. A second programmable erase pulse register is provided to indicate a number of subsequent erase pulses that can be applied to the non-volatile memory cells before performing additional scan operations.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:

an array of non-volatile memory cells;

a programmable erase pulse register to store X data; and control circuitry to perform erase operations on the array of non-volatile memory cells, wherein the erase operations comprise applying an erase voltage pulse to the non-volatile memory cells and performing an erase verification, the control circuitry terminates the erase verification when X erase pulses are applied to the array and initiates a scan operation of the memory cells to determine locations of un-erased memory cells.

2. The non-volatile memory device of claim 1 wherein the programmable erase pulse register comprises non-volatile memory cells.

3. The non-volatile memory device of claim 1 wherein the non-volatile memory cells are floating gate transistors.

4. A non-volatile memory device comprising:

an array of non-volatile memory cells;

a programmable erase pulse register to store X data; and control circuitry to perform erase operations on the array of non-volatile memory cells, wherein the erase operations comprise applying an erase voltage pulse to the non-volatile memory cells and performing an erase verification, the control circuitry terminates the erase verification when X erase pulses are applied to the array, wherein the erase operations further comprise performing an additional erase verification, the non-volatile memory device further comprises a second programmable erase pulse register to store Y data, wherein the second programmable erase pulse register is coupled to the control circuitry to instruct the control circuitry to terminate the additional erase verification when Y erase pulses are applied to the array.

5. A flash memory comprising:

an array of non-volatile memory cells arranged in erasable blocks;

a first programmable erase pulse register to store first data;

a second programmable erase pulse register to store second data; and control circuitry to perform first and second erase verification operations on the non-volatile memory cells, wherein the control circuitry terminates the first erase verification when X erase pulses are applied to the array in response to the first data, and the control circuitry terminates the second erase verification when Y erase pulses are applied to the array in response to the second data.

6. The flash memory of claim 5 wherein the first and second programmable erase pulse registers comprise non-volatile memory cells.

7. A method of erasing a non-volatile memory device comprising:

performing a memory erase verification operation;

reading a non-volatile register;

terminating the memory erase verification operation, in response to the non-volatile register, after applying X erase pulses to memory cells; and performing a scan operation to read a state of memory cells following the termination.

8. The method of claim 7 wherein the non-volatile register is programmed during manufacturing of the non-volatile memory device.

9. The method of claim 7 wherein the non-volatile register comprises non-volatile memory cells.

10. A method of erasing a non-volatile memory device comprising:

performing a memory erase verification operation;

reading a non-volatile register;

terminating the memory erase verification operation, in response to the non-volatile register, after applying X erase pulses to memory cells;

performing a scan operation to read a state of memory cells following the termination;

performing a second memory erase verification operation;

reading a second non-volatile register; and terminating the second erase verify operation, in response to the second non-volatile register, after applying Y erase pulses to memory cells.

11. The method of claim 10 wherein the second non-volatile register is programmed during manufacturing of the non-volatile memory device.

12. The method of claim 10 wherein the second non-volatile register comprises non-volatile memory cells.

13. A method of erasing a flash memory device comprising:

reading a first non-volatile register;

applying X erase pulses to memory cells during a first erase verification operation;

terminating the first erase verify operation in response to the first non-volatile register;

reading a second non-volatile register;

applying Y erase pulses to memory cells during a second erase verification operation; and terminating the second erase verify operation in response to the second non-volatile register.

14. The method of claim 13 wherein the first and second non-volatile registers each comprise flash memory cells.

15. The method of claim 13 wherein the first and second non-volatile registers are programmed during manufacturing of the flash memory device.

16. A method of manufacturing a non-volatile memory device comprising:

testing a plurality of non-volatile memory devices;

determining a first number of erase pulses required to erase a majority of programmed memory cells in the non-volatile memory devices; and programming a first non-volatile register in the non-volatile memory device to store data indicating the first number.

17. A method of manufacturing a non-volatile memory device comprising:

testing a plurality of non-volatile memory devices;

determining a first number of erase pulses required to erase a majority of programmed memory cells in the non-volatile memory devices;

programming a first non-volatile register in the non-volatile memory device to store data indicating the first number;

determining a second number of subsequent erase pulses required to erase a majority of partially erased memory cells in the non-volatile memory devices; and programming a second non-volatile register in the non-volatile memory device to store data indicating the second number.

18. The method of claim 17 wherein the first and second non-volatile registers comprise non-volatile memory cells.

19. The method of claim 17 wherein the first and second non-volatile registers comprise floating gate memory cells.

20. A method of erasing a flash memory device comprising:

storing a charge a floating gate of memory cells;

reading a first non-volatile register;

performing a scan operation when X erase pulses are applied to the floating gate of memory cells during a verification operation;

reading a second non-volatile register; and performing a second scan operation when Y erase pulses are applied to the floating gate of memory cells during a verification operation.

21. The method of claim 20 wherein the first and second non-volatile registers each comprise flash memory cells.

22. The method of claim 20 wherein the first and second non-volatile registers are programmed during manufacturing of the flash memory device.

23. A non-volatile memory device comprising:

an array of non-volatile memory cells;

control circuitry to apply erase voltage pulses to the non-volatile memory cells and perform erase verification and memory scan operations;

a pulse counter coupled to count the erase pulses applied to the non-volatile memory cells; and a programmable erase pulse register coupled to the control circuitry to indicate a plurality of erase pulses to be applied to the non-volatile memory cells during the erase verification operation prior to performing the memory scan operation.

24. A non-volatile memory device comprising:

an array of non-volatile memory cells;

control circuitry to apply erase voltage pulses to the non-volatile memory cells and perform erase verification and memory scan operations;

a pulse counter coupled to count the erase pulses applied to the non-volatile memory cells;

a programmable erase pulse register coupled to the control circuitry to indicate a plurality of erase pulses to be applied to the non-volatile memory cells during the erase verification operation prior to performing the memory scan operation;

wherein the control circuitry applies additional erase pulses following the memory scan operation, the non-volatile memory device further comprises a second programmable erase pulse register coupled to the control circuitry to indicate a second plurality of erase pulses to be applied to the non-volatile memory cells prior to performing a second memory scan operation.

* * * * *

UNITED STATES PATENT AND TRADEMARK OFFICE
CERTIFICATE OF CORRECTION

PATENT NO.        : 6,452,836 B1                                         Page 1 of 1
APPLICATION NO. : 09/803623
DATED             : September 17, 2002
INVENTOR(S)      : Frankie F. Roohparvar It is certified that error appears in the above-identified patent and that said Letters Patent is hereby corrected as shown below:

At column 7, line 35, replace "If the **pulse count is reached" with
--If the pulse count is reached--

Signed and Sealed this

Twenty-ninth Day of August, 2006

JON W. DUDAS
*Director of the United States Patent and Trademark Office*